(12) United States Patent
Kang et al.

(10) Patent No.: US 9,859,158 B2
(45) Date of Patent: Jan. 2, 2018

(54) METHOD FOR MANUFACTURING SEMICONDUCTOR DEVICE

(71) Applicant: Samsung Electronics Co., Ltd., Suwon-si, Gyeonggi-do (KR)

(72) Inventors: Kyunglyong Kang, Hwaseong-si (KR); Youngmok Kim, Suwon-si (KR); Hodae Oh, Hwaseong-si (KR); Kyoung-Eun Uhm, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/239,364

(22) Filed: Aug. 17, 2016

(65) Prior Publication Data

US 2017/0053806 A1 Feb. 23, 2017

(30) Foreign Application Priority Data

Aug. 18, 2015 (KR) .................. 10-2015-0116232

(51) Int. Cl.

| | | |
|---|---|---|
| *H01L 21/311* | (2006.01) | |
| *H01L 21/768* | (2006.01) | |
| *H01L 21/28* | (2006.01) | |
| *H01L 29/423* | (2006.01) | |
| *H01L 21/8234* | (2006.01) | |
| *H01L 29/49* | (2006.01) | |
| *H01L 29/51* | (2006.01) | |
| *H01L 29/78* | (2006.01) | |

(52) U.S. Cl.
CPC .. *H01L 21/76877* (2013.01); *H01L 21/28123* (2013.01); *H01L 21/31111* (2013.01); *H01L 21/31144* (2013.01); *H01L 21/823462* (2013.01); *H01L 29/42368* (2013.01); *H01L 21/823481* (2013.01); *H01L 29/4933* (2013.01); *H01L 29/513* (2013.01); *H01L 29/517* (2013.01); *H01L 29/7833* (2013.01)

(58) Field of Classification Search
CPC ......... H01L 21/28185; H01L 21/28052; H01L 21/31111

See application file for complete search history.

(56) References Cited

U.S. PATENT DOCUMENTS 6,649,514 B1 11/2003 Jiang et al.
6,773,975 B1 8/2004 Ramkumar et al.
(Continued)

FOREIGN PATENT DOCUMENTS

KR 1019980012625 4/1998
KR 1019980045950 9/1998
(Continued)

*Primary Examiner* — Bradley K Smith
(74) *Attorney, Agent, or Firm* — Ward and Smith, P.A.

(57) ABSTRACT

A method for manufacturing a semiconductor device includes forming a device isolation layer in a substrate to define an active region, forming a gate insulating layer covering at least a portion of the active region, forming a gate electrode on the gate insulating layer, and forming an interlayer insulating layer on the gate electrode. The gate insulating layer includes a first portion overlapping with the active region and a second portion overlapping with the device isolation layer. The forming of the gate insulating layer includes etching at least a part of the second portion of the gate insulating layer to thin the part of the second portion of the gate insulating layer.

18 Claims, 14 Drawing Sheets

(56) References Cited

U.S. PATENT DOCUMENTS

| | | | |
|---|---|---|---|
| 6,849,485 B1 | 2/2005 | Chin | |
| 2004/0256658 A1* | 12/2004 | Park | H01L 21/76224 |
| | | | 257/315 |
| 2005/0036382 A1 | 2/2005 | Kato | |
| 2005/0062080 A1* | 3/2005 | Nakamura | H01L 29/66772 |
| | | | 257/288 |
| 2006/0108641 A1 | 5/2006 | Jong et al. | |
| 2011/0269277 A1 | 11/2011 | Kronholz et al. | |
| 2013/0168763 A1 | 7/2013 | Hashitani | |

FOREIGN PATENT DOCUMENTS

| | | |
|---|---|---|
| KR | 1019990012284 | 2/1999 |
| KR | 1020070084883 A | 8/2007 |
| KR | 1020080061195 A | 7/2008 |

\* cited by examiner

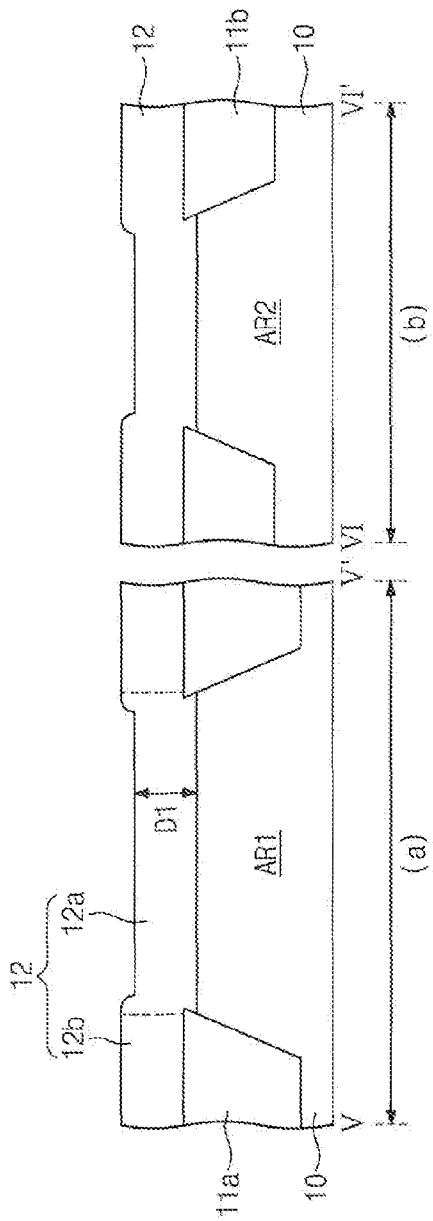
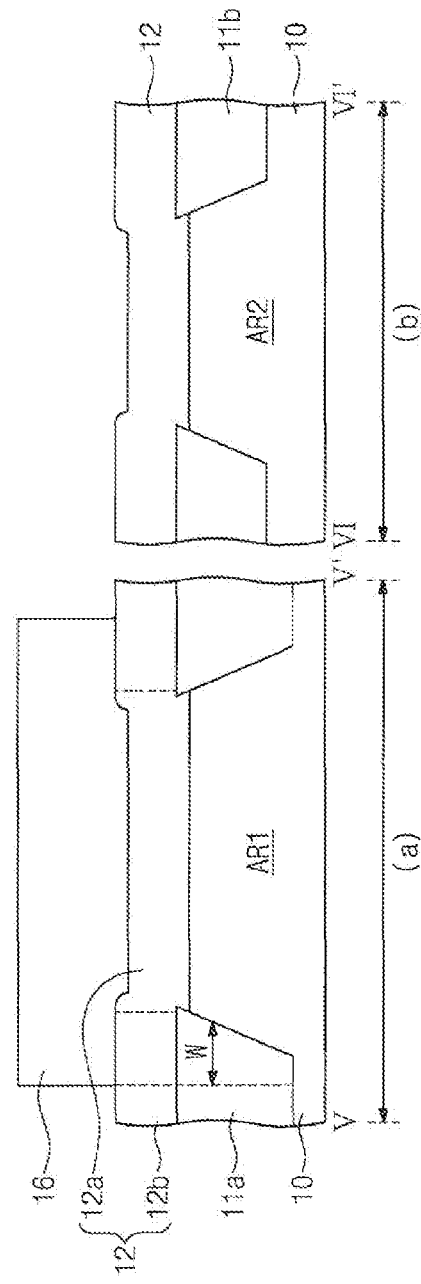

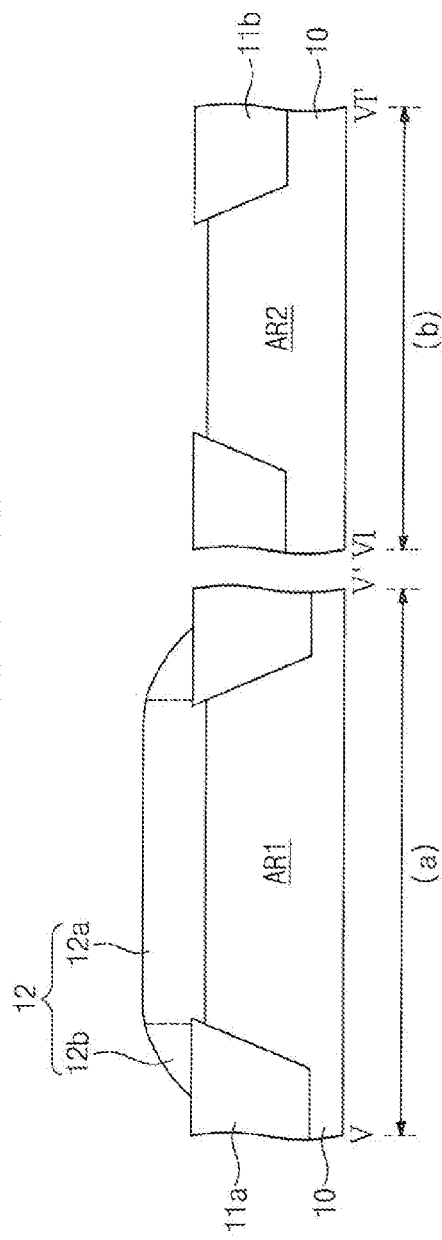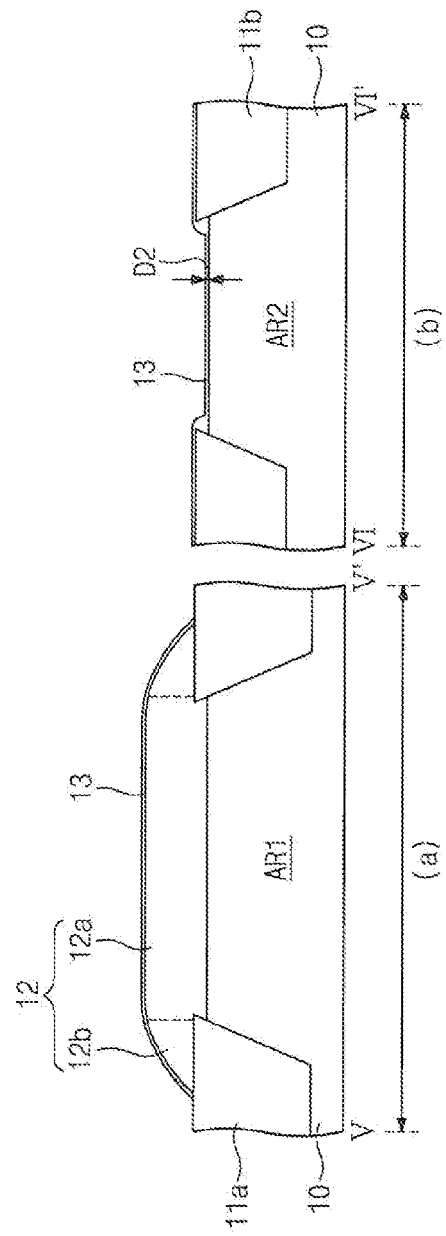

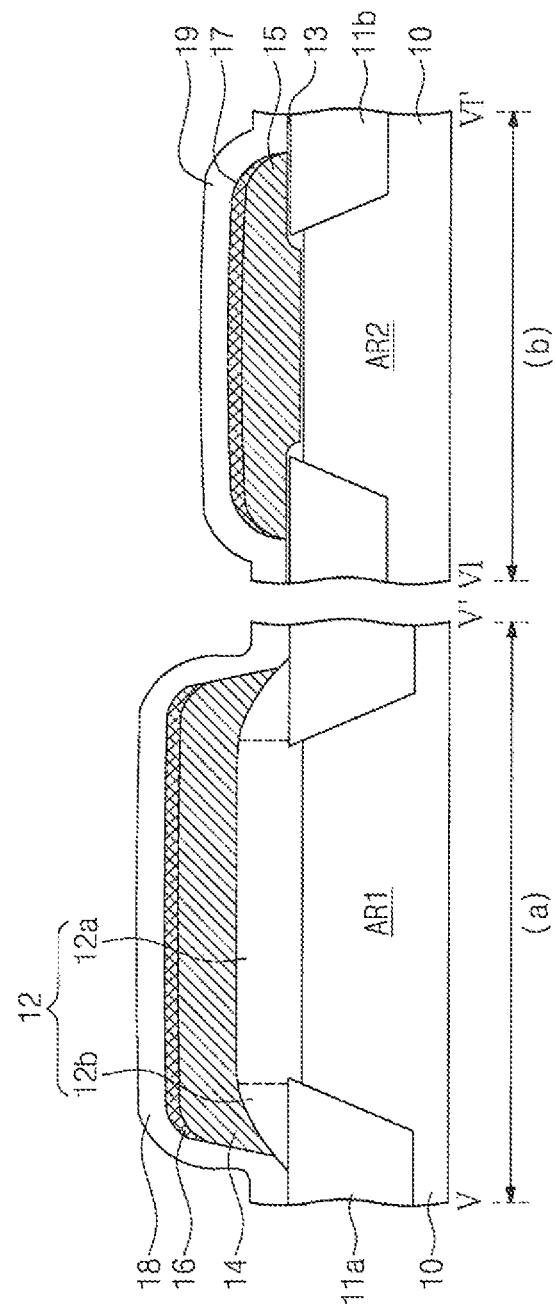

METHOD FOR MANUFACTURING SEMICONDUCTOR DEVICE

CROSS-REFERENCE TO RELATED APPLICATION

This U.S. non-provisional patent application claims priority under 35 U.S.C. §119 to Korean Patent Application No. 10-2015-0116232, filed on Aug. 18, 2015, in the Korean intellectual Property Office, the disclosure of which is hereby incorporated by reference in its entirety.

BACKGROUND

Embodiments of the inventive concepts relate to methods for manufacturing a semiconductor device. More particularly, embodiments of the inventive concepts relate to methods for manufacturing a semiconductor device including a high-voltage transistor.

A low-voltage transistor and a high-voltage transistor may be used in a semiconductor device (e.g., a flash memory device) that needs a high voltage for performing program and erase operations. The low-voltage and high-voltage transistors provided in peripheral circuits of this semiconductor device may include gate insulating layers having thicknesses different from each other. Since the high-voltage transistor is driven by a high voltage, the gate insulating layer of the high-voltage transistor may be thicker than the gate insulating layer of the low-voltage transistor.

SUMMARY

Embodiments of the inventive concepts may provide methods for manufacturing a semiconductor device capable of improving a process margin between a gate pattern and a metal interconnection.

Embodiments of the inventive concepts may also provide methods for manufacturing a semiconductor device capable of improving process efficiency without an additional process.

In one aspect, a method for manufacturing a semiconductor device may include forming a device isolation layer on a substrate to define an active region, forming a gate insulating layer covering at least a portion of the active region, forming a gate electrode on the gate insulating layer, and forming an interlayer insulating layer on the gate electrode. The gate insulating layer may include a first portion overlapping with the active region, and a second portion overlapping with the device isolation layer. The forming of the gate insulating layer may include etching at least a part of the second portion of the gate insulating layer to thin the part of the second portion of the gate insulating layer.

In an embodiment, the method may further include forming a metal interconnection on the interlayer insulating layer overlapping with the second portion of the gate insulating layer.

In an embodiment, the etching of the part of the second portion of the gate insulating layer overlapping with the device isolation layer may include forming a mask pattern that covers the first portion of the gate insulating layer and the at least a portion of the second portion of the gate insulating layer and exposes another portion of the second portion of the gate insulating layer, and wet-etching the second portion of the gate insulating layer using the mask pattern as an etch mask.

In an embodiment, one sidewall of the mask pattern may be spaced apart from the first portion.

In an embodiment, the part of the second portion of the gate insulating layer that is etched may be thinned by a swelling phenomenon.

In an embodiment the method may further include forming a silicide pattern disposed on the gate electrode.

In an embodiment, the method may further include forming a capping layer on the silicide pattern.

In an embodiment, one end of the gate electrode may overlap with the second portion of the gate insulating layer.

In an embodiment, the first portion of the gate insulating layer may have a thickness of about 500 Å to about 1000 Å.

In another aspect, a method for manufacturing a semiconductor device may include preparing a substrate including a device isolation layer defining an active region, forming a gate insulating layer on the active region, the gate insulating layer including an extending portion overlapping with the device isolation layer, forming a gate electrode on the gate insulating layer, forming an interlayer insulating layer on the gate electrode, and forming a metal interconnection on the interlayer insulating layer overlapping with the extending portion of the gate insulating layer. The forming of the gate insulating layer may include etching at least a part of the extending portion of the gate insulating layer to adjust a thickness of the part of the extending portion of the gate insulating layer.

In an embodiment, the etching of the at least a portion of the extending portion may include wet-etching the part of the extending portion of the gate insulating layer.

In an embodiment, the etching of the part of the extending portion of the gate insulating layer may include using a mask pattern as an etch mask. The mask pattern may cover at least a portion of the extending portion and may expose another portion of the extending portion. One sidewall of the mask pattern may be spaced apart from an interface between the device isolation layer and the active region.

In an embodiment, the part of the extending portion of the gate insulating layer may be etched by a swelling phenomenon.

In an embodiment, the method may further include forming a silicide pattern disposed on the gate electrode.

In an embodiment, the method may further include forming a capping layer on the silicide pattern.

In yet another aspect, a method of manufacturing a flash memory device may include forming a gate insulating layer on a substrate including a device isolation layer defining an active region; forming a mask pattern on the first gate insulating layer; etching the first gate insulating layer; and removing the mask pattern, wherein the first gate insulating layer includes a first portion overlapping with the active region, the first portion having a thickness, and a second portion overlapping with the device isolation layer, wherein the mask pattern formed overlaps with the first portion of the gate insulating layer and overlaps with a portion of a the second portion of the gate insulating layer, and wherein at least a part of the second portion of the gate insulating layer overlapped by the mask pattern is etched.

In yet another aspect, embodiments of the inventive concept may include semiconductor devices, such as semiconductor devices including a high-voltage transistor (e.g., flash memory devices), that are manufactured according to methods as set forth herein.

BRIEF DESCRIPTION OF THE DRAWINGS

The inventive concepts will become more apparent in view of the attached drawings and accompanying detailed description.

FIGS. 6A to 6H are cross-sectional views illustrating a method for manufacturing a semiconductor device according to example embodiments of the inventive concepts.

DETAILED DESCRIPTION OF THE EMBODIMENTS

Figure 1:
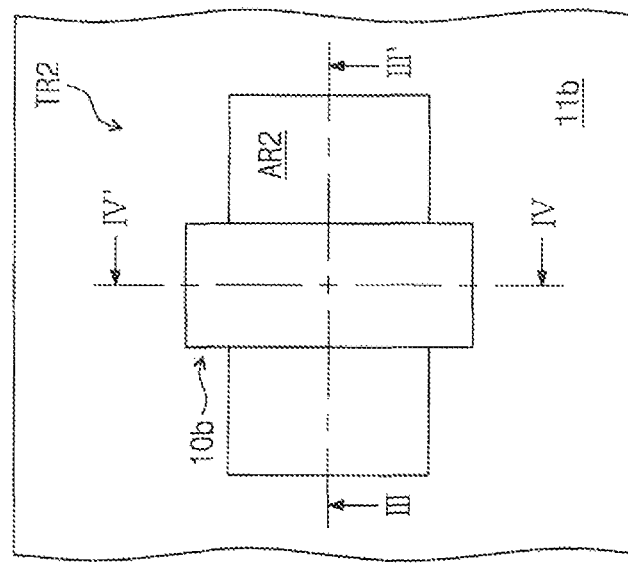
FIG. 1 is a plan view schematically illustrating a conventional semiconductor device.
Figure 1:
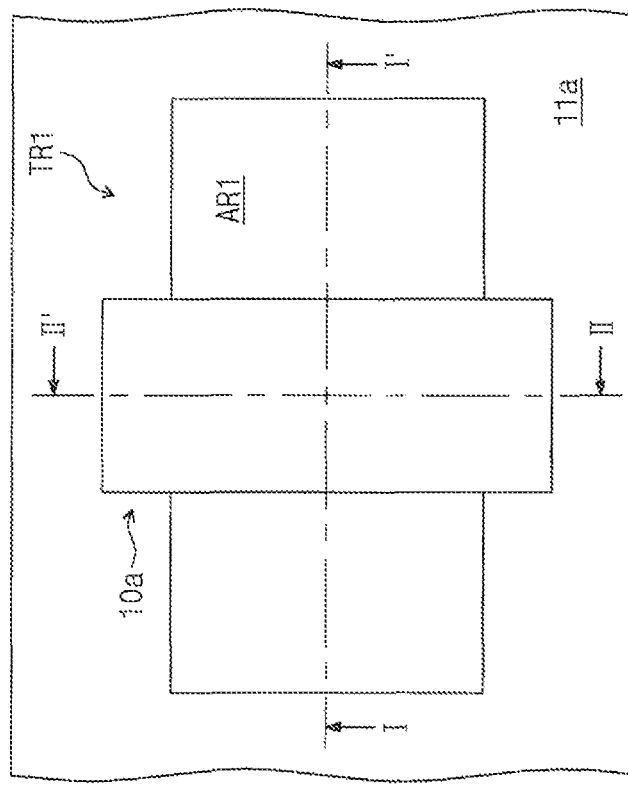

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity. The same reference numerals or the same reference designators denote the same elements throughout the specification.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items it will be understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. It will be further understood that when an element such as a layer, region or substrate is referred to as being "on" or "overlapping" another element, it can be directly on or overlapping the other element or intervening elements may be present. In contrast, the term "directly on" or "directly overlapping" means that there are no intervening elements.

Moreover, exemplary embodiments are described herein with reference to cross-sectional views and/or plan views that are idealized exemplary views. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 2A:
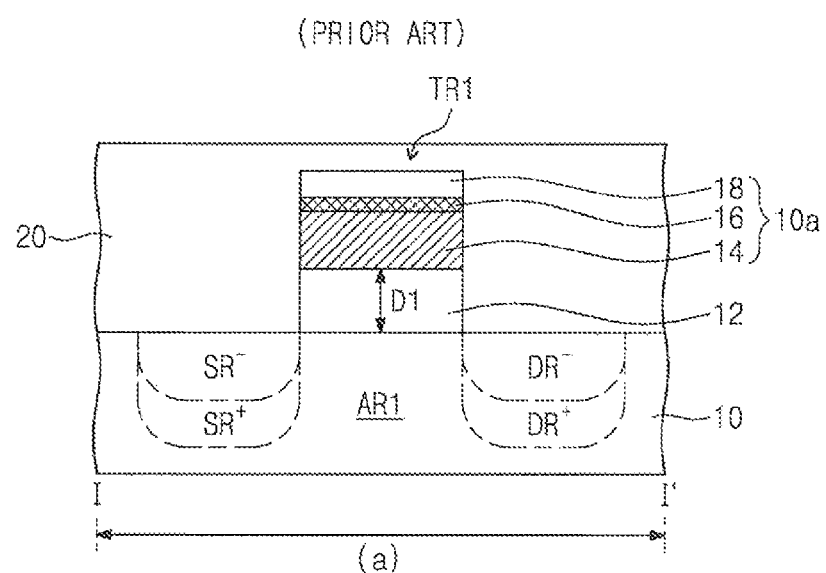
FIG. 2A is a cross-sectional view taken along a line I-I' of FIG. 1.
Figure 2B:
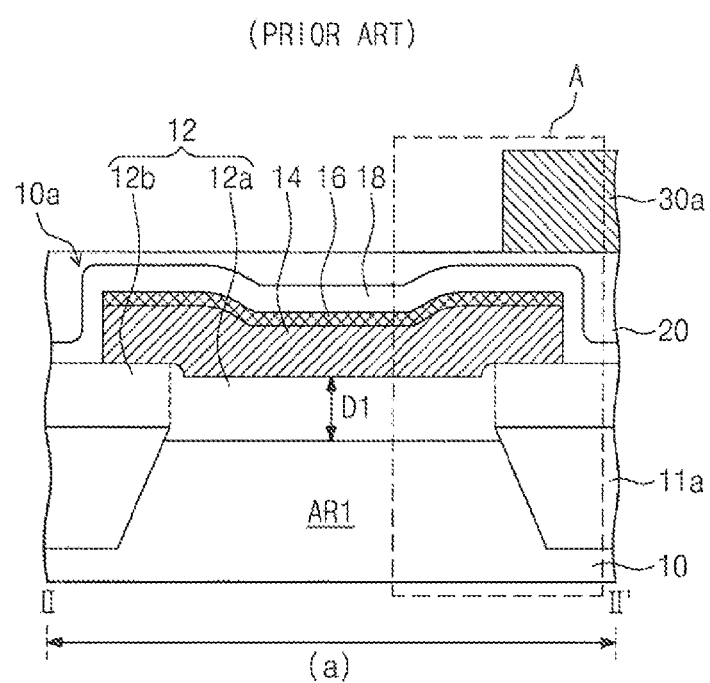
FIG. 2B is a cross-sectional view taken along a line II-II' of FIG. 1.
Figure 2C:
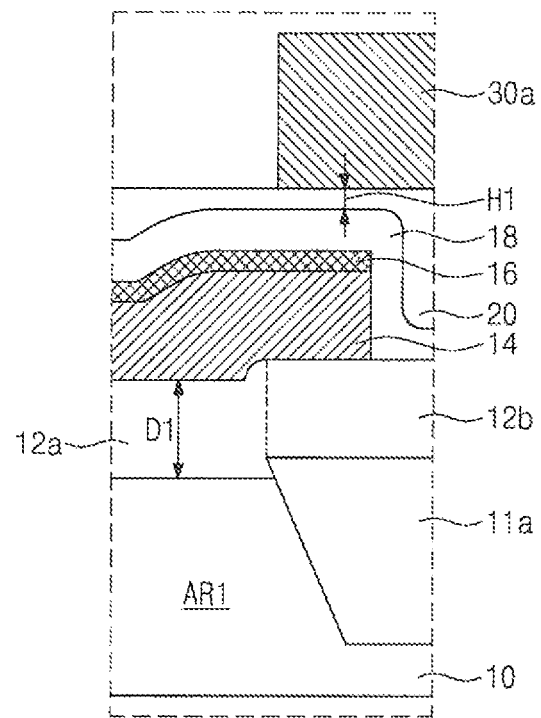
FIG. 2C is an enlarged view of a portion 'A' of FIG. 2B.
Figure 3A:
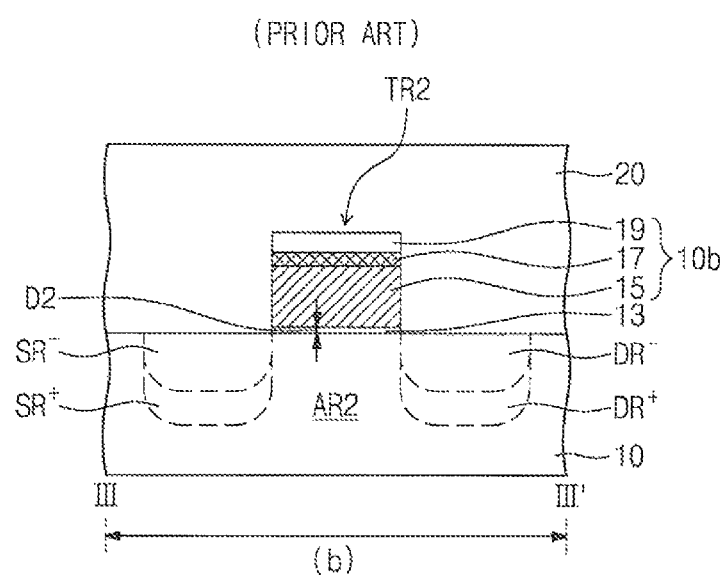
FIG. 3A is a cross-sectional view taken along a line III-III' of FIG. 1.
Figure 3B:
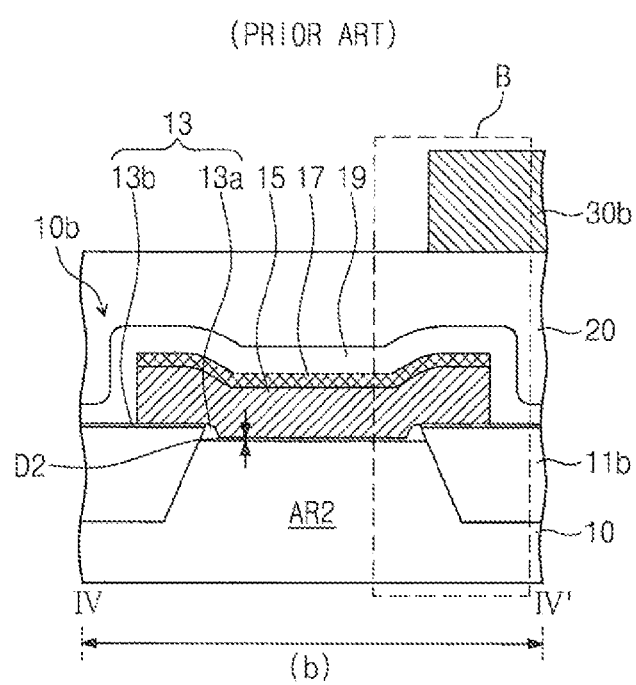
FIG. 3B is a cross-sectional view taken along a line IV-IV' of FIG. 1.
Figure 3C:
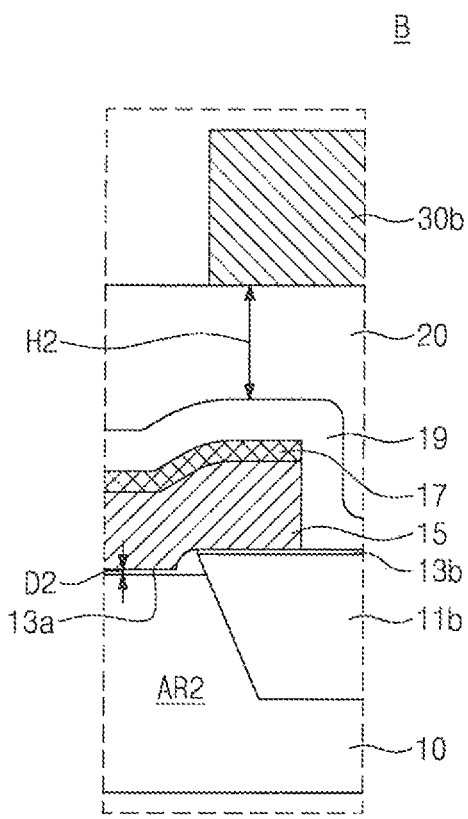
FIG. 3C is an enlarged view of a portion 'B' of FIG. 3B.

FIG. 1 is a plan view schematically illustrating a conventional semiconductor device 1. FIG. 2A is a cross-sectional view taken along a line I-I' of FIG. 1. FIG. 2B is a cross-sectional view taken along a line of II-II' FIG. 1. FIG. 2C is an enlarged view of a portion 'A' of FIG. 2B. FIG. 3A is a cross-sectional view taken along a line III-III' of FIG. 1. FIG. 3B is a cross-sectional view taken along a line IV-IV' of FIG. 1. FIG. 3C is an enlarged view of a portion 'B' of FIG. 3B. Hereinafter, the conventional semiconductor device 1 will be described with reference to FIGS. 1, 2A to 2C, and 3A to 3C. The semiconductor device 1 may include a first region (a) and a second region (b). The first region (a) and the second region (b) may be a high-voltage region (a) and a low-voltage region (b) of a peripheral circuit region of the semiconductor device 1, respectively.

Referring to FIGS. 1, 2A to 2C, and 3A to 3C, a first transistor TR1 may be provided on a substrate 10 of the first region (a), and a second transistor TR2 may be provided on the substrate 10 of the second region (b). The first transistor TR1 may be a high-voltage transistor, and the second transistor TR2 may be a low-voltage transistor. The first transistor TR1 may include a first dopant region SR⁻ and SR⁺, a second dopant region DR⁻ and DR⁺, and a first gate pattern 10a. The second transistor TR2 may include a first dopant region SR⁻ and SR⁺, a second dopant region DR⁻ and DR⁺, and a second gate pattern 10b. The first transistor TR1 may be an N-type transistor. Alternatively, the first transistor TR1 may be a P-type transistor. The second transistor TR2 may be the same type as or a different type from the first transistor TR1.

The first gate pattern 10a and the second gate pattern 10b may be provided on a first active region AR1 and a second active region AR2, respectively. The first gate pattern 10a may include a first gate electrode 14, a first silicide layer 10, and a first capping layer 18. The second gate pattern 10b may include a second gate electrode 15, a second silicide layer 17, and a second capping layer 19. Spacers (not shown) may be provided on both sidewalls of each of the first and second gate patterns 10a and 10b.

First and second gate insulating layers 12 and 13 may be provided between the substrate 10 and the first and second gate patterns 10a and 10b, respectively. The first and second gate insulating layers 12 and 13 may include silicon oxide and/or a high-k dielectric material. The first gate insulating layer 12 may include a first portion 12a and a second portion 12b. The first portion 12a of the first gate insulating layer 12 may overlap with the first active region AR1, and the second portion 12b of the first gate insulating layer 12 may overlap with a first device isolation layer 11a. In other word, the first gate insulating layer 12 may intersect the first active region AR1. In this case, the first portion 12a of the first gate insulating layer 12 may overlap with the first active region AR1, and the second portion 12b of the first insulating layer 12 may extend from the first portion 12a to overlap with the first device isolation layer 11a beyond the first active region AR1.

The second gate insulating layer 13 may include a first portion 13a and a second portion 13b. The first portion 13a of the second gate insulating layer 13 may overlap with the second active region AR2, and the second portion 13b of the second gate insulating layer 13 may overlap with a second device isolation layer 11b. In other word, the second gate insulating layer 13 may intersect the second active region AR2. In this case, the first portion 13a of the second gate insulating layer 13 may overlap with the first active region AR1, and the second portion 13b of the second insulating layer 13 may extend from the first portion 13a to overlap with the second device isolation layer 11b beyond the second active region AR2.

The first dopant region SR⁻ and SR⁺ and the second dopant region DR' and DR⁺ may be provided in the substrate 10 at both sides of each of the gate patterns 10a and 10b, respectively. The first dopant region SR⁻ and SW⁺ and the second dopant region DR⁻ and DR⁺ may correspond to a source region and a drain region of each of the transistors TR1 and TR2. The source region SR⁻ and SR⁺ may include a low-concentration source region SR⁻ and a high-concentration source region SR⁺. The drain region DR⁻ and DR⁺ may include a low-concentration drain region DR⁻ and a high-concentration drain region DR⁺. Each of the first dopant region SR⁻ and SR⁺ and the second dopant region DR⁻ and DR⁺ may have a double-diffused drain (DDD) structure in which the low-concentration SR⁻ or DR⁻ surrounds the high-concentration region SR⁺ or DR⁺.

An interlayer insulating layer 20 may be provided on the substrate 10. The interlayer insulating layer 20 may cover the first and second gate patterns 10a and 10b and the dopant regions SR⁻ and SR⁺ and DR⁻ and DR⁺. Contact plugs (not shown) may penetrate the interlayer insulating layer 20 so as to be electrically connected to the dopant regions SR⁻ and SR⁺ and DR⁻ and DR⁺. First and second metal interconnections 30a and 30b may be disposed on the interlayer insulating layer 20 so as to be electrically connected to the contact plugs (not shown). For example the first metal interconnection 30a may be provided on the interlayer insulating layer 20 overlapping with the second portion 12b of the first gate insulating layer 12. The second metal interconnection 30b may be provided on the interlayer insulating layer 20 overlapping with the second portion 13b of the second gate insulating layer 13.

The first gate insulating layer 12 of the first transistor TR1 may have a first thickness D1, and the second gate insulating layer 13 of the second transistor TR2 may have a second thickness D2. The second thickness D2 may be smaller than the first thickness D1. For example the second thickness D2 may range from about 5 Å to about 30 Å, and the first thickness D1 may range from about 500 Å to about 1000 Å. Since the first gate insulating layer 12 of the first transistor TR1 has the first thickness D1 which is relatively thick, the first transistor TR1 may have a characteristic that sufficiently resists a high voltage. Since the second gate insulating layer 13 of the second transistor TR2 has the second thickness D2 which is relatively thin, a driving speed of the semiconductor device 1 may be improved. By a difference between the thicknesses D1 and D2 of the first and second gate insulating layers 12 and 13, a distance between the first transistor TR1 and a top surface of the interlayer insulating layer 20 may be different from a distance between the second transistor TR2 and the top surface of the interlayer insulating layer 20. In other words, a first distance H1 between the first transistor TR1 and the top surface of the interlayer insulating layer 20 may be smaller than a second distance H2 between the second transistor TR2 and the top surface of the interlayer insulating layer 20. The first distance H1 may correspond to a distance between the first gate pattern 10a and the first metal interconnection 30a, and the second distance H2 may correspond to a distance between the second gate pattern 10b and the second metal interconnection 30b. Thus, a relatively great parasitic capacitance may occur between the first transistor TR1 and the first metal interconnection 30a. In addition, a process margin may be reduced by the small distance H1 between the first gate pattern 10a and the top surface of the interlayer insulating layer 20.

Figure 4:
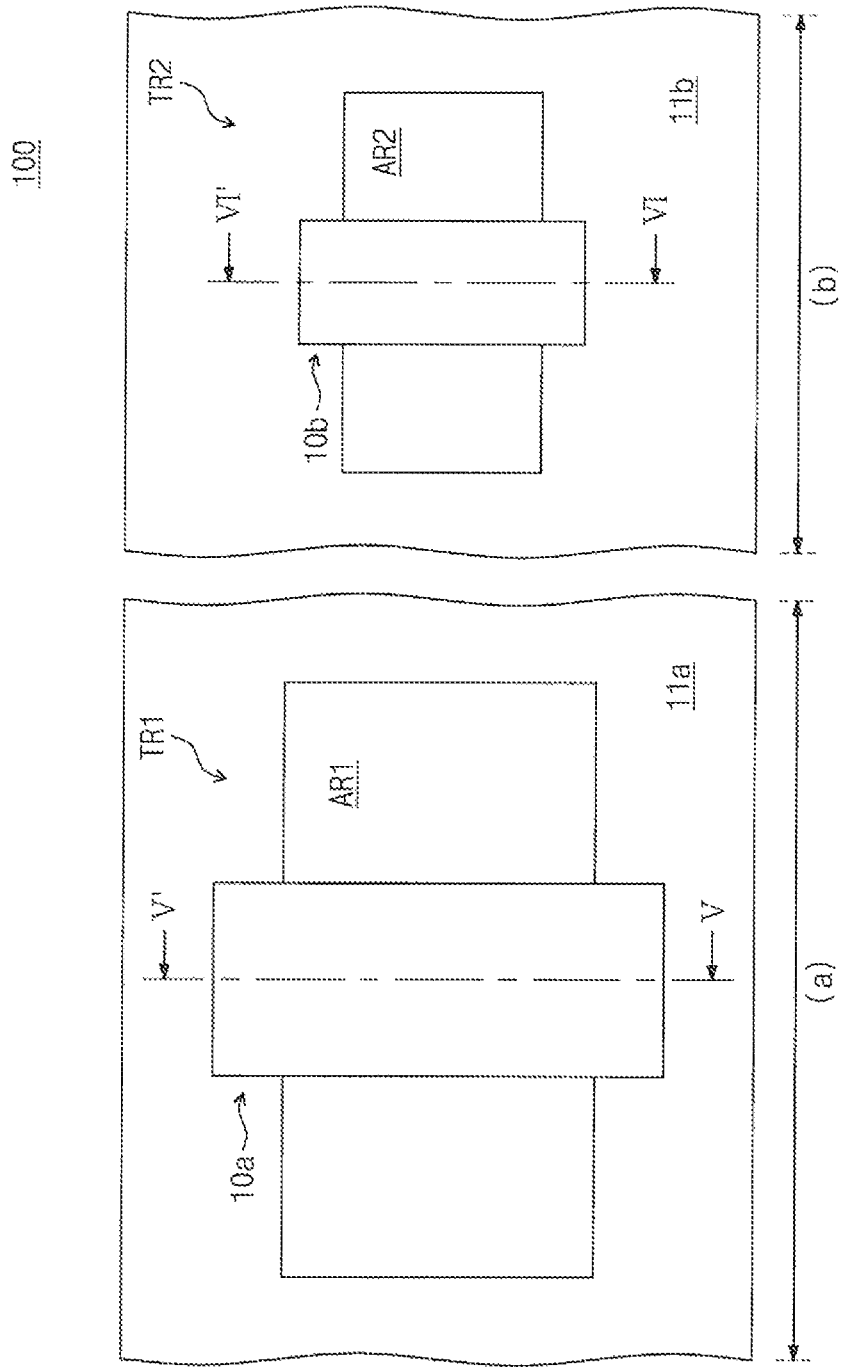
FIG. 4 is a plan view illustrating a semiconductor device according to example embodiments of the inventive concepts.
Figure 5A:
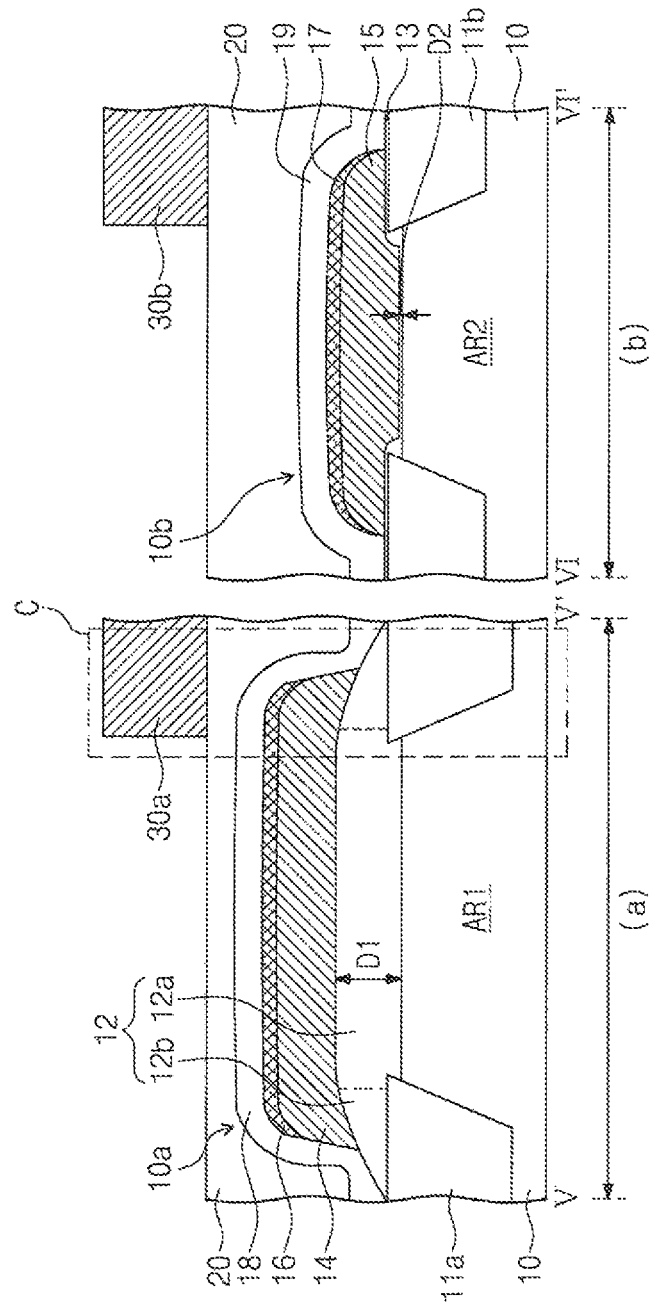
FIG. 5A is a cross-sectional view taken along lines V-V' and VI-VI' of FIG. 4.
Figure 5B:
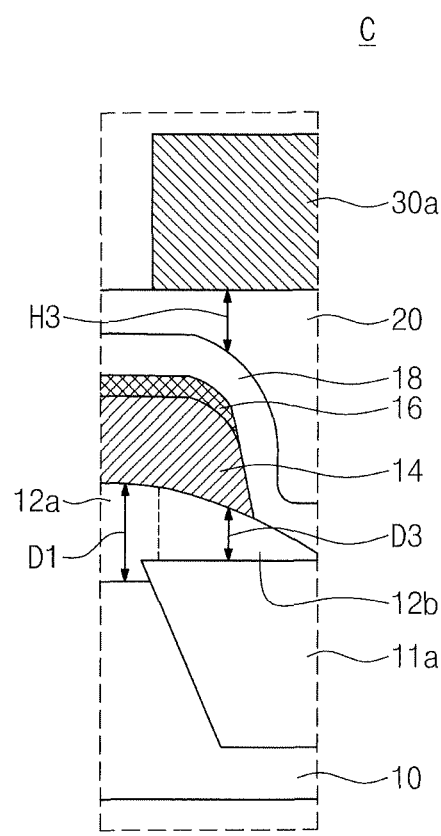
FIG. 5B is an enlarged view of a portion 'C' of FIG. 5A.

FIG. 4 is a plan view illustrating a semiconductor device 100 according to example embodiments of the inventive concepts. FIG. 5A is a cross-sectional view taken along lines V-V' and VI-VI' of FIG. 4. FIG. 5B is an enlarged view of a portion 'C' of FIG. 5A. The semiconductor device 100 according to embodiments of the inventive concepts will be described with reference to FIGS. 4, 5A, and 5B hereinafter. The semiconductor device 100 may include a first region (a) and a second region (b). The first region (a) and the second region (b) may be a high-voltage region (a) and a low-voltage region (b) of a peripheral circuit region of the semiconductor device 100, respectively.

A first transistor TR1 may be provided on a substrate 10 of the first region (a). The first transistor TR1 may be a high-voltage transistor. A second transistor TR2 may be provided on the substrate 10 of the second region (b) The second transistor TR2 may be a low-voltage transistor. The first transistor TR1 may include first and second docent regions and a first gate pattern 10a. The second transistor TR2 may include first and second dopant regions and a second gate pattern 10b. The first transistor TR1 may be an N-type transistor. Alternatively, the first transistor TR1 may be a P-type transistor. The second transistor TR2 may be the same type as or a different type from the first transistor TR1. However, embodiments of the inventive concepts are not limited thereto.

A voltage applied to the high-voltage transistor TR1 may be higher than a voltage applied to the low-voltage transistor TR2. In an embodiment, a driving voltage of about 10V to about 200V may be applied to the high-voltage transistor TR1, and a driving voltage of about 5V or less may be applied to the low-voltage transistor TR2. In some embodiments, the transistors TR1 and TR2 may be planar transistors. However, embodiments of the inventive concepts are not limited thereto. In some embodiments, the transistors TR1 and TR2 may be three-dimensional transistors having trench-type gates or fin-shaped channels for reducing a short-channel effect.

A first active region AR1 of the first region (a) may be defined by a first device isolation layer 11a, and a second active region AR2 of the second region (b) may be defined by a second device isolation layer 11b. Widths and/or depths of the first and second device isolation layers 11a and 11b may be different from each other. In some embodiments, since the high voltage is applied to the first region (a), the width and depth of the first device isolation layer 11a may be greater than those of the second device isolation layer 11b. In some embodiments, top surfaces of the first and second device isolation layers 11a and 11b may be higher than top surfaces of the first and second active regions AR1 and AR2. The first and second device isolation layers 11a and 11b may be a field oxide (FOX) formed by a local oxidation of silicon (LOCOS) method or may be formed by a shallow-trench isolation (STI) method. The substrate 10 may be a silicon substrate, a transparent substrate, or a silicon-on-insulator (SOI) substrate.

The first gate pattern 10a may be provided on the substrate 10 of the first region (a), and the second gate pattern 10b may be provided on the substrate 10 of the second region (b). The first gate pattern 10a may include a first gate electrode 14 and a first silicide pattern 16 which are sequentially stacked on the substrate 10. The second gate pattern 10b may include a second gate electrode 15 and a second silicide pattern 17 which are sequentially stacked on the substrate 10. A first capping layer 18 may cover the first gate pattern 10a, and a second capping layer 19 may cover the second gate pattern 10b. The gate electrodes 14 and 15 may include doped poly-silicon and/or a metal. The silicide patterns 16 and 17 may include a metal silicide. For example the silicide patterns 16 and 17 may include tungsten silicide, nickel silicide, cobalt silicide, or titanium silicide. The silicide patterns 16 and 17 may reduce resistances of the gate electrodes 14 and 15. The capping layers 18 and 19 may include silicon nitride or silicon oxynitride. In some embodiments, the capping layers 18 and 19 may be omitted. Spacers (not shown) may be provided on both sidewalls of each of the gate patterns 10a and 10b. The spacers (not shown) may include silicon oxide and/or silicon oxynitride.

A first gate insulating layer 12 may be provided between the substrate 10 and the first gate pattern 10a, and a second gate insulating layer 13 may be provided between the substrate 10 and the second gate pattern 10b. The first and second gate insulating layers 12 and 13 may include silicon oxide and/or a high-k dielectric material. The high-k dielectric material means a material of which a dielectric constant is higher than that of silicon oxide. In some embodiments the dielectric constant of the high-k dielectric material may be 10 or more. For example, the high-k dielectric material may include an oxide, aluminate or silicate including at least one of hafnium (Hf), zirconium (Zr), aluminum (Al), titanium (Ti), lanthanum (La), yttrium (Y), gadolinium (Gd), or tantalum (Ta). Each of the first and second gate insulating layers 12 and 13 including the high-k dielectric material may have a single-layered structure or a multi-layered structure. In the case in which the first and second gate insulating layers 12 and 13 include the high-k dielectric material, a buffer layer (not shown) may further be provided between the substrate 100 and each of the first and second gate insulating layers 12 and 13. The buffer layer may include silicon oxide or silicon oxynitride. The buffer layer may improve interface characteristics between the substrate 10 and the gate insulating layers 12 and 13.

The first gate insulating layer 12 of the first region (a) may include a first portion 12a and a second portion 12b. The first portion 12a of the first gate insulating layer 12 may overlap with the first active region AR1, and the second portion 12b of the first gate insulating layer 12 may overlap with the first device isolation layer 11a. In other word, the first gate insulating layer 12 may intersect the first active region AR1. In this case, the first portion 12a of the first gate insulating layer 12 may overlap with the first active region AR1, and the second portion 12b of the first insulating layer 12 may extend from the first portion 12a to overlap with the first device isolation layer 11a beyond the first active region AR1. The first gate insulating layer 12 may have a first thickness D1. In some embodiments, the first thickness D1 may range from about 500 Å to about 1000 Å. At this time, at least a part of the second portion 12b of the first gate insulating layer 12 may be thinner than the first portion 12a of the first gate insulating layer 12. The part of the second portion 12b of the first gate insulating layer 12 may have a third thickness D3. In some embodiments, the third thickness D3 may range from about 5 Å to about 500 Å. The second gate insulating layer 13 of the second region (b) may include a first portion 13a overlapping with the second active region AR2 and a second portion 13b overlapping with the second device isolation layer 11b. The second gate insulating layer 13 may have a second thickness D2. In some embodiments, the second thickness D2 may range from about 5 Å to about 30 Å.

An interlayer insulating layer 20 may be provided on the substrate 10. The interlayer insulating layer 20 may cover the gate patterns 10a and 10b and the dopant regions. Contact plugs (not shown) may penetrate the interlayer insulating layer 20 so as to be electrically connected to the dopant regions. First and second metal interconnections 30a and 30b may be disposed on the interlayer insulating layer 20 so as to be electrically connected to the contact plugs (not shown). In some embodiments, the first metal interconnection 30a may be provided on the interlayer insulating layer 20 overlapping with the second portion 12b of the first gate insulating layer 12. The second metal interconnection 30b may be provided on the interlayer insulating layer 20 overlapping with the second portion 13b of the second gate insulating layer 13.

Referring to FIGS. 5A and 5B the at least a part of the second portion 12b of the first gate insulating layer 12 may be thinner than the first portion 12a of the first gate insulating layer 12. For example, the first portion 12a of the first gate insulating layer 12 may have the first thickness D1, but the part of the second portion 12b of the first gate insulating layer 12 may have the third thickness D3. The third thickness D3 may be smaller than the first thickness D1. For example, the first thickness D1 may range from about 500 Å to about 1000 Å, and the third thickness D3 may range from about 5 Å to about 500 Å. Thus, a distance between the top surface of the interlayer insulating layer 20 and the second gate pattern 10b disposed on the second portion 12b of the first gate insulating layer 12 may have a third distance H3. The third distance H3 may correspond to a distance between the first gate pattern 10a and the first metal interconnection 30a. Referring to FIGS. 2C and 5B, the third distance H3 is greater than the first distance H1. Thus, according to embodiments of the inventive concepts, the distance H3 between the first gate pattern 10a and the first metal interconnection 30a may be increased to improve a process margin. For example, it is possible to easily form a contact (not shown) connecting the first gate pattern 10a to the first metal interconnection 30a. As a result, the first transistor TR1 may have a sufficient voltage-resistance characteristic due to the first portion 12a of the first gate insulating layer 12 having the relatively thick thickness, and the process margin between the first gate pattern 10a and the first metal interconnection 30a may be improved due to the second portion 12b of the first gate insulating layer 12 having the relatively thin thickness. In addition, it is possible to reduce or minimize a parasitic capacitance between the first gate pattern 10a and the first metal interconnection 30a.

FIGS. 6A to 6H are cross-sectional views illustrating a method for manufacturing a semiconductor device according to example embodiments of the inventive concepts. FIGS. 6A to 6H are cross-sectional views corresponding to the lines V-V' and VI-VI' of FIG. 4. Profiles of components of a semiconductor device are exaggerated for clarity in FIGS. 6A to 6H.

Referring to FIG. 6A, a substrate 10 including a first region (a) and a second region (b) may be prepared. A first device isolation layer 11a may be formed in the substrate 10 of the first region (a) to define a first active region AR1, and a second device isolation layer 11b may be formed in the substrate 10 of the second region (b) to define a second active region AR2. The first and second device isolation layers 11a and 11b may be formed by different processes at different times. Alternatively, the first and second device isolation layers 11a and 11b may be formed at the same time. A first gate insulating layer 12 may be formed on the substrate 10 of the first and second regions (a) and (b). At this time, the first gate insulating layer 12 of the first region (a) may include a first portion 12a and a second portion 12b. The first portion 12a of the first gate insulating layer 12 may overlap with the first active region AR1, and the second portion 12b of the first gate insulating layer 12 may overlap with the first device isolation layer 11a. The first gate insulating layer 12 may have a first thickness D1. The first gate insulating layer 12 may be formed by a chemical vapor deposition (CVD) method or a thermal oxidation process. The first gate insulating layer 12 may include silicon oxide. Alternatively, the first gate insulating layer 12 may include a dielectric material different from silicon oxide. For example, the first gate insulating layer 12 may include at least one of a tantalum oxide layer, a titanium oxide layer, a hafnium oxide layer, a zirconium oxide layer, an aluminum oxide layer, an yttrium oxide layer, a niobium oxide layer, or an indium oxide layer.

Referring to FIGS. 6B and 6C, a mask pattern 16 may be formed on the first gate insulating layer 12 of the first region (a), and the first gate insulating layer 12 may be etched using the mask pattern 16 as an etch mask. The mask pattern 16 may cover the first portion 12a of the first gate insulating layer 12 and a portion of the second portion 12b of the first gate insulating layer 12 and may expose another portion of the second portion 12b. At this time, the first gate insulating layer 12 of the second region (b) may also be exposed. Thus, the exposed portion of the second portion 12b of the first gate insulating layer 12 of the first region (a) and the first gate insulating layer 12 of the second region (b) may be etched using the mask pattern 16 as the etch mask. One sidewall of the mask pattern 16 may be laterally spaced apart from the first portion 12a of the first gate insulating layer 12 by a predetermined distance W. The one sidewall of the mask pattern 16 may be laterally spaced apart from an interface between the first active region AR1 and the first device isolation layer 11a by the predetermined distance W. The mask pattern 16 may be a photoresist pattern. The exposed portion of the second portion 12b of the first gate insulating layer 12 of the first region (a) and the first gate insulating layer 12 of the second region (b), which are exposed by the mask pattern 16, may be etched using a wet etching process. Subsequently, the mask pattern 16 may be removed. The mask pattern 16 may be removed by an ashing strip process.

A swelling phenomenon may occur when the first gate insulating layer 12 is etched using the mask pattern 16 as the etch mask. The swelling phenomenon may mean that an etching solution permeates into the second portion 12b of the first gate insulating layer 12 along an interface between the mask pattern 16 and the first gate insulating layer 12. Thus, a boundary of the second portion 12b of the first gate insulating layer 12, which is exposed by the mask pattern 16, may be etched or recessed toward the first portion 12a of the first gate insulating layer 12. In other words, the second portion 12b of the first gate insulating layer 12 under an edge of the mask pattern 16 may also be etched or recessed, and thus, the second portion 12b of the first gate insulating layer 12 may have a gentle slope.

Referring to FIG. 6D, a second gate insulating layer 13 may be formed on the substrate 10 of the first and second regions (a) and (b). The second gate insulating layer 13 may have a second thickness D2. The second thickness D2 may be smaller than the first thickness D1. The second gate insulating layer 13 may be stacked or additionally grown on the first gate insulating layer 12 of the first region (a). However, the second gate insulating layer 13 may be much thinner than the first gate insulating layer 12, and thus, the second gate insulating layer 13 of the first region (a) may not be considered. The second gate insulating layer 13 may be formed by a thermal oxidation method or a CVD method. In some embodiments, the first and second gate insulating layer 12 and 13 may have the same material.

Figure 6E:
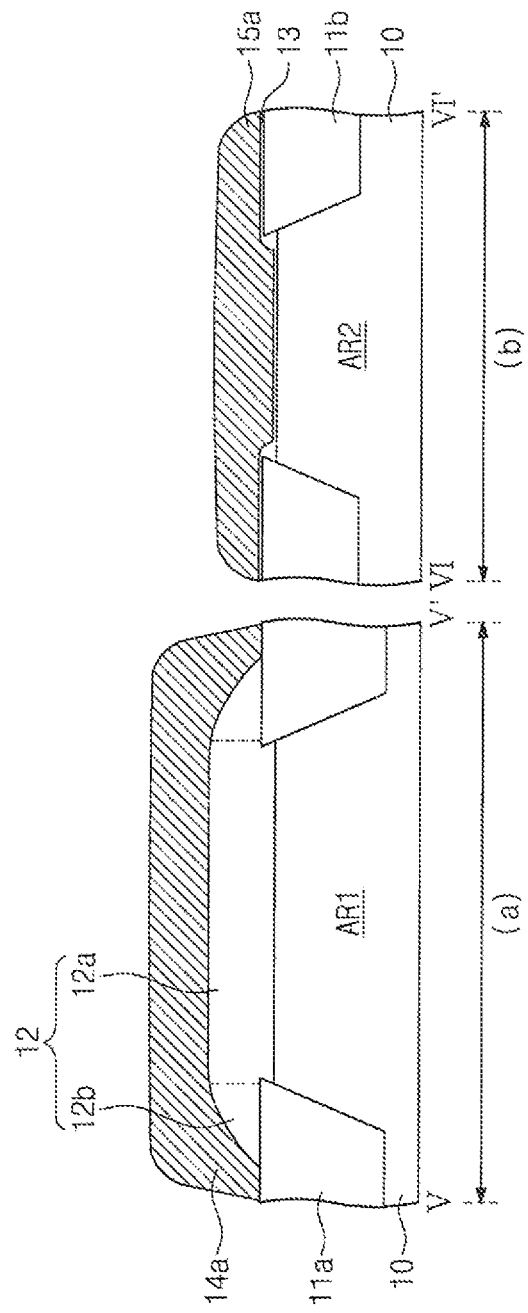

Referring to FIG. 6E, gate electrode layers 14a and 15a may be formed on the substrate 10 of the first and second regions (a) and (b), respectively. The gate electrode layers 14a and 15a may include a conductive material. The gate electrode layers 14a and 15a may be formed of a single-layer or multi-layer including of doped amorphous silicon, doped poly-silicon, doped poly-SiGe, or a material containing a conductive metal. The material containing the conductive metal may include at least one of a metal (e.g., tungsten or molybdenum) or a conductive metal nitride (e.g., titanium nitride, tantalum nitride, or tungsten nitride).

Figure 6F:
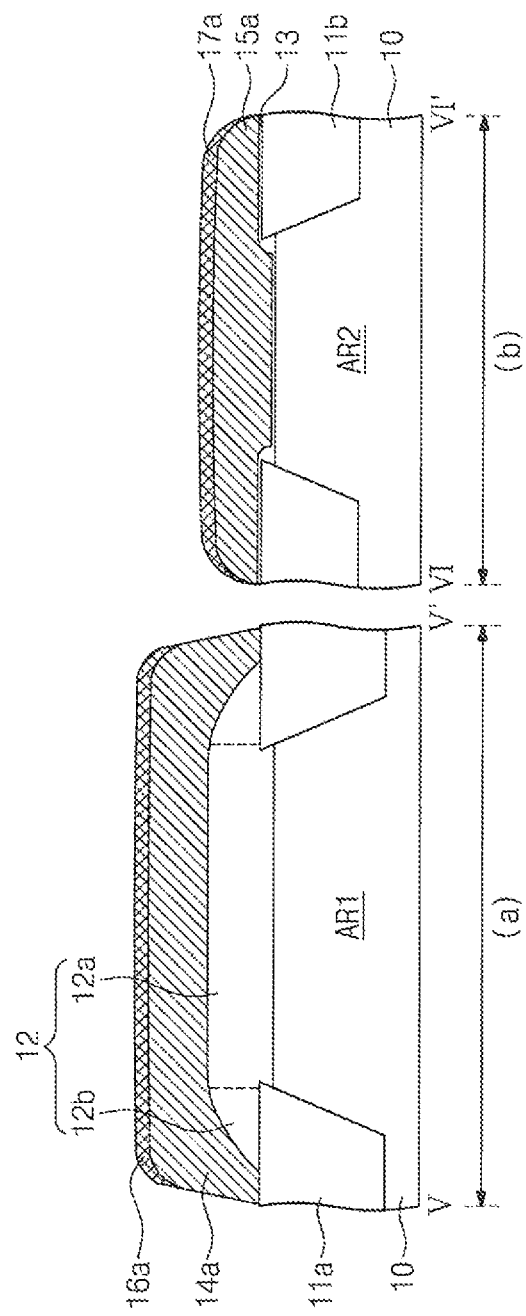

Referring to FIG. 6F, silicide layers 16a and 17a may be formed on the gate electrode layers 14a and 15a, respectively. The silicide layers 16a and 17a may include at least one of tungsten silicide, nickel silicide, cobalt silicide, or titanium silicide.

Figure 6H:
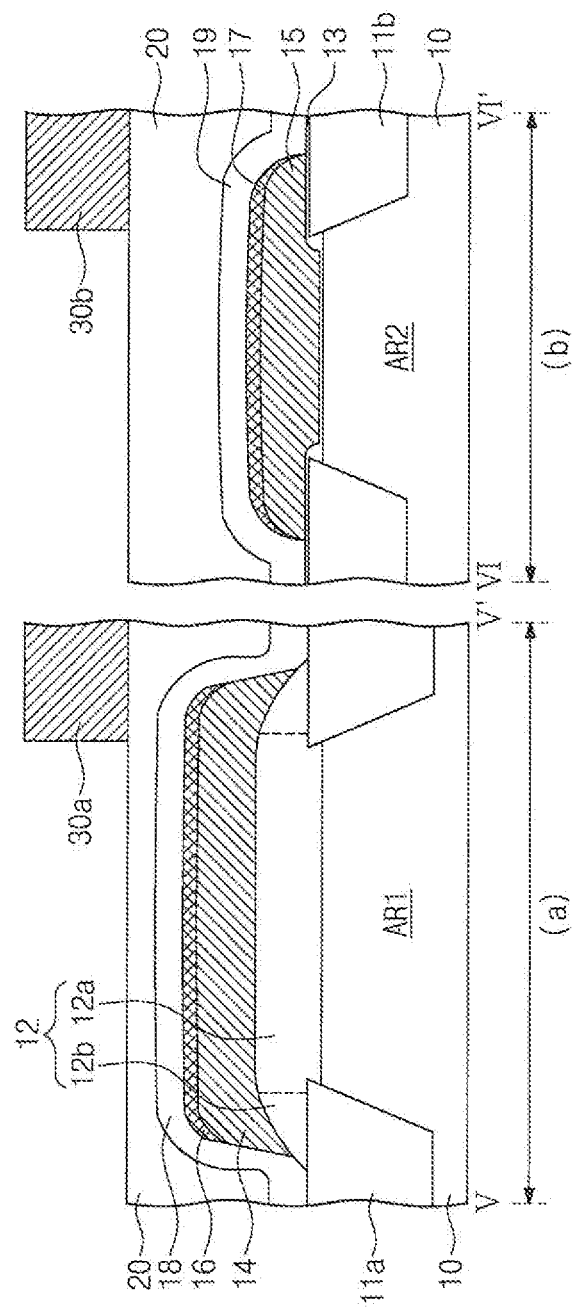

Referring to FIGS. 6G and 6H, the silicide layer 16a and 17a and the gate electrode layers 14a and 15a may be patterned to form a first gate electrode 14 and a first silicide pattern 16 on the substrate 10 of the first region (a) and a second gate electrode 15 and a second silicide pattern 17 on the substrate 10 of the second region (b). Dopant regions may be formed in the first active region AR1 at both sides of the first gate electrode 14 and in the second active region AR2 at both sides of the second gate electrodes 15. The dopant regions may be formed by an ion implantation process. First and second capping layers 18 and 19 may be formed on the first and second gate electrodes 14 and 15, respectively. The first capping layer 18 may be conformally formed on the substrate 10 of the first region (a), and the second capping layer 19 may be conformally formed on the substrate 10 of the second region (b). Thereafter, an interlayer insulating layer 20 may be formed on the first and second capping layers 18 and 19. Contacts (not shown) may be formed to penetrate the interlayer insulating layer 20. The contacts (not shown) may be electrically connected to the dopant regions of the first and second regions (a) and (b), respectively. First and second metal interconnections 30a and 30b may be formed on the interlayer insulating layer 20 so as to be electrically connected to the contacts (not shown). The first metal interconnection 30a may be formed on the interlayer insulating layer 20 of the first region (a). In some embodiments, the first metal interconnection 30a may overlap with the second portion 12b of the first gate insulating layer 12. The second metal interconnection 30b may be formed on the interlayer insulating layer 20 of the second region (b). In some embodiments, the second metal interconnection 30b may overlap with the second portion of the second gate insulating layer 13, which overlaps with the second device isolation layer 11b. The first and second metal interconnections 30a and 30b may be a pad-type conductive pattern or a line-type conductive pattern.

According to embodiments of the inventive concepts, at least a part of the second portion 12b of the first gate insulating layer 12 of the first region (a) may also be etched when the first gate insulating layer 12 of the second region (b) is etched. Thus, the thickness of the first gate insulating layer 12 may be selectively controlled without an additional process. In addition, a size of the mask pattern 16 (e.g., the distance W between the one sidewall of the mask pattern 16 and the first active region AR1) may be adjusted according to a layout of the semiconductor device 100, and thus, the design of the semiconductor device 100 may be variously modified.

According to embodiments of the inventive concepts, the portion of the gate insulating layer of the high-voltage transistor, which overlaps with the device isolation pattern, may also be etched without an additional process when the gate insulating layer is etched. Thus, the process margin of the interlayer insulating layer may be improved. Due to the swelling phenomenon, the portion of the gate insulating layer may be etched to be inclined toward another portion of the gate insulating layer under the mask pattern. Thus, a total size of the semiconductor device may not be affected but the distance between the gate pattern and the top surface of the interlayer insulating layer may be increased to improve the process margin.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method for manufacturing a semiconductor device, the method comprising:
    forming a device isolation layer on a substrate to define an active region;
    forming a gate insulating layer covering at least a portion of the active region, wherein the gate insulating layer comprises a first portion overlapping with the active region and a second portion overlapping with the device isolation layer;
    thinning at least a part of the second portion of the gate insulating layer by: forming a mask pattern that covers the first portion of the gate insulating layer and at least a portion of the second portion of the gate insulating layer and exposes another portion of the second portion of the gate insulating layer; and wet-etching the second portion of the gate insulating layer using the mask pattern as an etch mask;
    forming a gate electrode on the gate insulating layer;
    forming an interlayer insulating layer on the gate electrode; and
    forming a metal interconnection on the interlayer insulating layer overlapping with the second portion of the gate insulating layer.

2. The method of claim 1, wherein one sidewall of the mask pattern is spaced apart from the first portion.

3. The method of claim 1, wherein at least a part of the second portion of the gate insulating layer is thinned by an etching solution permeating along an interface between the mask pattern and the gate insulating layer and etching part of the second portion of the gate insulating layer.

4. The method of claim 1, further comprising:
    forming a silicide pattern disposed on the gate electrode.

5. The method of claim 4, further comprising:
    forming a capping layer on the silicide pattern.

6. The method of claim 1, wherein one end of the gate electrode overlaps with the second portion of the gate insulating layer.

7. The method of claim 1, wherein the first portion of the gate insulating layer has a thickness of about 500 Å to about 1000 Å.

8. A method for manufacturing a semiconductor device, the method comprising:
    preparing a substrate comprising a device isolation layer defining an active region;
    forming a gate insulating layer on the active region, the gate insulating layer comprising an extending portion overlapping with the device isolation layer;
    wet-etching at least a part of the extending portion of the gate insulating layer to adjust a thickness of the part of the extending portion of the gate insulating layer;
    forming a gate electrode on the gate insulating layer;
    forming an interlayer insulating layer on the gate electrode; and
    forming a metal interconnection on the interlayer insulating layer overlapping with the extending portion of the gate insulating layer.

9. The method of claim 8, wherein wet-etching of the part of the extending portion of the gate insulating layer comprises: using a mask pattern as an etch mask,
    wherein the mask pattern covers at least a part of the extending portion of the gate insulating layer and exposes another part of the extending portion of the gate insulating layer, and
    wherein one sidewall of the mask pattern is spaced apart from an interface between the device isolation layer and the active region.

10. The method of claim 9, wherein part of the extending portion of the gate insulating layer is etched by an etching solution permeating along an interface between the mask pattern and the gate insulating layer.

11. The method of claim 10, further comprising:
    forming a silicide pattern disposed on the gate electrode.

12. The method of claim 11, further comprising:
    forming a capping layer on the silicide pattern.

13. A method of manufacturing a flash memory device, the method comprising:
    forming a gate insulating layer of a high voltage transistor in the flash memory device on a substrate comprising a device isolation layer defining an active region;
    forming a mask pattern on the gate insulating layer, wherein the mask pattern has an edge positioned over the device isolation layer;
    wet-etching the gate insulating layer to thin a portion of the gate insulating layer; and
    removing the mask pattern.

14. The method of claim 13, wherein:
    the gate insulating layer comprises a first portion overlapping with the active region, the first portion having a thickness, and a second portion overlapping with the device isolation layer;
    the mask pattern formed overlaps with the first portion of the gate insulating layer and overlaps with at least a portion of a the second portion of the gate insulating layer;
    at least a part of the second portion of the gate insulating layer overlapped by the mask pattern is wet-etched and has a thickness that is less than the thickness of the first portion of the gate insulating layer; and
    wherein the part of the second portion of the gate insulating layer is wet-etched by an etching solution permeating along an interface between the mask pattern and the gate insulating layer.

15. The method of claim 14, wherein the part of the second portion of the gate insulating layer that is etched has a gentle slope with a thickness that is less than the thickness of the first portion of the gate insulating layer.

16. The method of claim 14, further comprising, after removal if the mask pattern, forming a gate electrode on the gate insulating layer, and forming an interlayer insulating layer on the gate electrode.

17. The method of claim 16, further comprising forming a metal interconnection on the interlayer insulating layer overlapping the second portion of the gate insulating layer.

18. The method of claim 13, wherein the portion of the gate insulating layer is thinned by an etching solution permeating along an interface between the mask pattern and the gate insulating layer.

* * * * *